United States Patent [19]

Fisher et al.

[11] Patent Number: 4,644,191
[45] Date of Patent: Feb. 17, 1987

[54] PROGRAMMABLE ARRAY LOGIC WITH SHARED PRODUCT TERMS

[75] Inventors: Barbara J. Fisher, Palm Bay; Ian E. Harvey, Melbourne, both of Fla.

[73] Assignee: Harris Corporation, Melbourne, Fla.

[21] Appl. No.: 777,685

[22] Filed: Sep. 19, 1985

[51] Int. Cl.[4] .......................................... H03K 19/086
[52] U.S. Cl. ................................... 307/465; 307/202.1; 307/466
[58] Field of Search .................... 307/202.1, 465–469; 340/825.83, 825.84; 364/716

[56] References Cited

U.S. PATENT DOCUMENTS

| | | | |
|---|---|---|---|
| 3,975,623 | 8/1976 | Weinberger | 328/92 |
| 4,124,899 | 11/1978 | Birkner et al. | 307/465 |
| 4,245,324 | 1/1981 | Machol et al. | 364/716 |
| 4,409,499 | 10/1983 | Zapisek et al. | 307/468 |
| 4,433,331 | 2/1984 | Kollaritsch | 307/465 |
| 4,554,640 | 11/1985 | Wong et al. | 307/465 |

OTHER PUBLICATIONS

"Programmable Array Logic—PAL32R16 and HAL32R16" by Monolithic Memories.

Primary Examiner—John S. Heyman
Assistant Examiner—Margaret R. Wambach
Attorney, Agent, or Firm—Barnes & Thornburg

[57] ABSTRACT

A programmable logic circuit comprises a Programmable Array Logic (PAL) circuit in which individual product terms may be shared simultaneously by one or more of the circuit outputs. The product terms are selectively connected to the circuit outputs by programmable elements (such as a fusible link) to increase design flexibility. Isolating devices are provided in series with the programmable elements to allow for the simultaneous product term sharing.

11 Claims, 2 Drawing Figures

PROGRAMMABLE ARRAY LOGIC WITH SHARED PRODUCT TERMS

BACKGROUND AND SUMMARY OF THE INVENTION

This invention relates generally to a programmable logic circuit and, more particularly, to improvements in a programmable logic circuit commonly referred to as a programmable array logic, or PAL (note: PAL is a trademark of Monolithic Memories, Inc.).

U.S. Pat. No. 4,124,899 to Birkner, et al. shows a programmable logic circuit which includes a programmable array or matrix interconnecting circuit inputs and the inputs to a plurality of AND gates. The outputs of the AND gates, which logically are products of selected polarities of selected inputs, are subgrouped and are nonprogrammably connected as inputs to individual, specified OR gates. The outputs of the OR gates are, logically speaking, sums of these product terms.

Making the OR gate inputs nonprogrammable sacrifices a degree of design flexibility when comparing these devices to programmable logic arrays (PLA's) which are programmable in both AND and OR arrays. However, the reduction in IC chip size and improvement in speed for the PAL circuit is substantial and results in advantages which more than offset the reduction in flexibility.

One problem in the design of PAL circuits stems from the fact that PAL's have a fixed number of product terms (PT's) per output. The number of PT's to be allocated to each output has been a recurring question for PAL designers. Too few product terms per output unduly limits flexibility and utility of the device. However, each additional product term increases the size of the IC, reduces overall device speed, and increases power consumption. In an attempt to address this problem, some devices offer a different number of PT's on each output. While this approach may be satisfactory in certain situations, problems are still likely to arise in applications requiring some degree of design flexibility.

An object of the present invention is to provide a PAL circuit architecture which allows two or more of the sum of the product outputs to share all or some portion of the product terms.

Another object of the present invention is to provide a PAL circuit architecture which allows the circuit designer to programmably allocate individual product terms to one or more of the circuit outputs.

Yet another object of the present invention is to provide for electrical isolation of the device outputs to allow one product term to be simultaneously shared by more than one of the device outputs.

These objects are attained in a programmable logic circuit comprising: an array having a plurality of inputs and a plurality of outputs and circuitry for combining selected ones of the inputs at each of the outputs; circuitry for connecting a first set of the array outputs to a first of a plurality of logic circuit outputs; circuitry for connecting a second set of the array outputs to a second logic circuit output; wherein the first set of array outputs includes less than all of the available outputs; and wherein this first set includes at least one output in common with the second set of array outputs. In a preferred embodiment of the invention, the second set of array outputs includes less than all of the available array outputs.

Restated in slightly different terms, the programmable logic circuit of the present invention comprises: an array having a plurality of inputs for receiving input terms and a plurality of outputs and circuitry for combining selected ones of the input terms at each of the array outputs; circuitry for connecting a first array output to a first of a plurality of outputs of the logic circuit; circuitry for connecting a second array output to a second logic circuit output; and circuitry for selectively connecting a third array output to either or both of the first and second logic circuit outputs. The array in the programmable logic circuit is preferably a product term generator, such as an AND array, and the combinations of input terms at the array outputs are product terms (PT's).

The circuitry for connecting each of the array outputs to the logic circuit outputs comprises a programmable element serially connected to isolating circuitry for electrically isolating the first and second logic circuit outputs. The isolating circuitry preferably includes a three-terminal device having a first terminal connected to the programmable element, a second terminal connected to a power source and a third terminal connected to one of the array outputs. In a preferred embodiment, the three-terminal device is a transistor having a control terminal (i.e., the base terminal) connected to the array output.

The PAL architecture of the present invention increases the effective number of PT's without increasing the actual total number. The shared product terms allow two outputs having equations which contain the same PT to be connected to one physical PT, rather than requiring that PT to be generated twice as is common in a conventional PAL circuit. Thus, the new architecture increases the effective number of PT's without increasing power consumption or degrading device speed.

It should be noted that the programmable logic circuit of the present invention is intended to include devices which are mask-programmable, as well as those that are field programmable. With the latter type, the programming feature of the present invention allows the user to recover from programming errors and make design changes without necessarily having to sacrifice a device. However, for particular high volume applications, a mask-progammable array which embodies the shared product terms of the present invention may be cost effective.

Other objects, advantages and novel features of the present invention will become apparent from the following detailed description of the invention when considered in conjunction with the accompanying drawings.

DETAILED DESCRIPTION OF THE DRAWINGS

Figure 1:
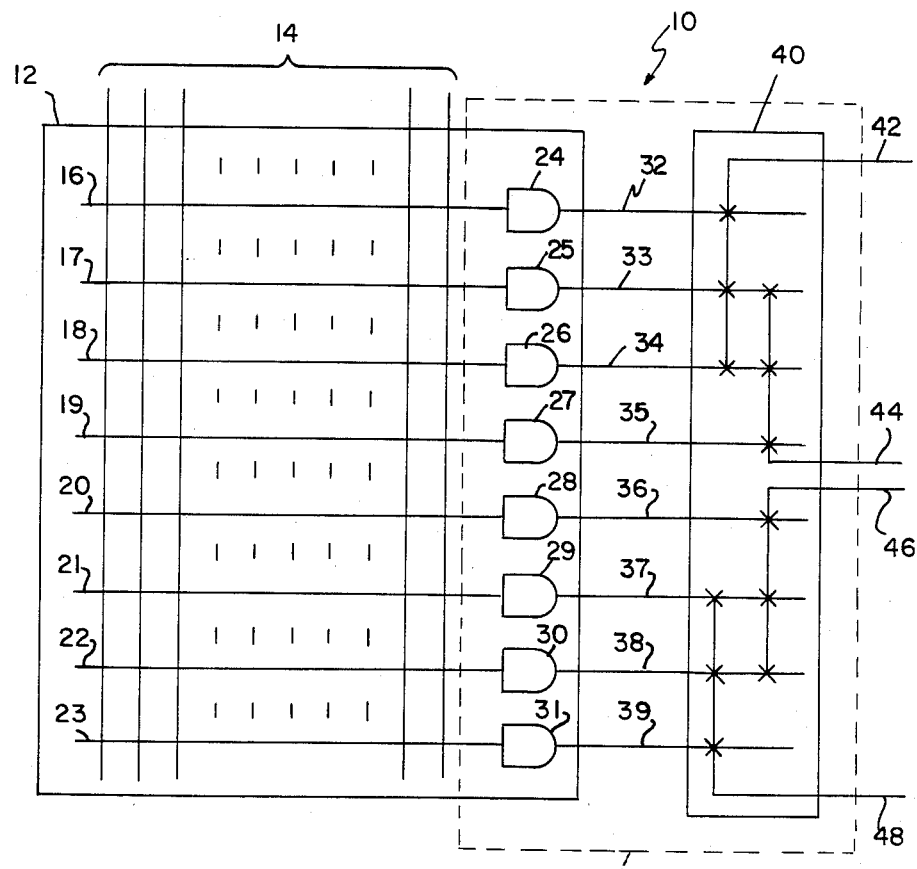
FIG. 1 is a schematic illustration of a programmable logic circuit constructed in accordance with the present invention.

FIG. 1 shows a schematic illustration of a portion of a programmable logic circuit 10 constructed in accordance with the present invention. Logic circuit 10 includes an array 12 which, in the preferred embodiment shown, is a matrix of circuit input terms, indicated generally by reference numeral 14, and inputs 16-23 to AND gates 24-31. Inputs 16-23, which are schematically depicted in FIG. 1, can be selectively connected to circuit input terms 14, depending upon the particular product terms required at each of outputs 32-39. The selective connection between input terms 14 and gate inputs 16-23 may be formed in the manufacturing process (i.e., the device may be mask-programmable). Alternatively, the matrix may be constructed in a field programmable form by providing fuse elements connecting each input term 14 to each gate input. This approach leaves the final decision regarding the make-up of the product terms to the designer. For purposes of clarity, the "x's" which are normally used to indicate a fused connection between intersecting lines in a matrix (i.e., input terms 14 and AND gate inputs 16-23) are omitted in FIG. 1.

In the block marked 40 in FIG. 1, each of the gate outputs 32-39 are programmably connected to one or more of logic circuit outputs 42, 44, 46 and 48. The fused connection between subgroups of outputs 32-39 and each of logic circuits 42-48 are indicated in FIG. 1 by "x's" at the line intersections. In the circuit as illustrated in FIG. 1, gate output 32 is connected to, and may be programmably disconnected from, circuit output 42. Gate output 33 is connected to, and may be programmably disconnected from, either circuit output 42 or circuit output 44. Thus, the product term present on gate output 33 can be shared by logic circuit outputs 42 and 44. Various combinations, other than the particular one shown in FIG. 1, provide for flexibility in the allocation of product terms to one or more of the logic circuit outputs. The portion of logic circuit 10 which is enclosed by dotted line 50 in FIG. 1 is shown in greater detail in FIG. 2.

Figure 2:
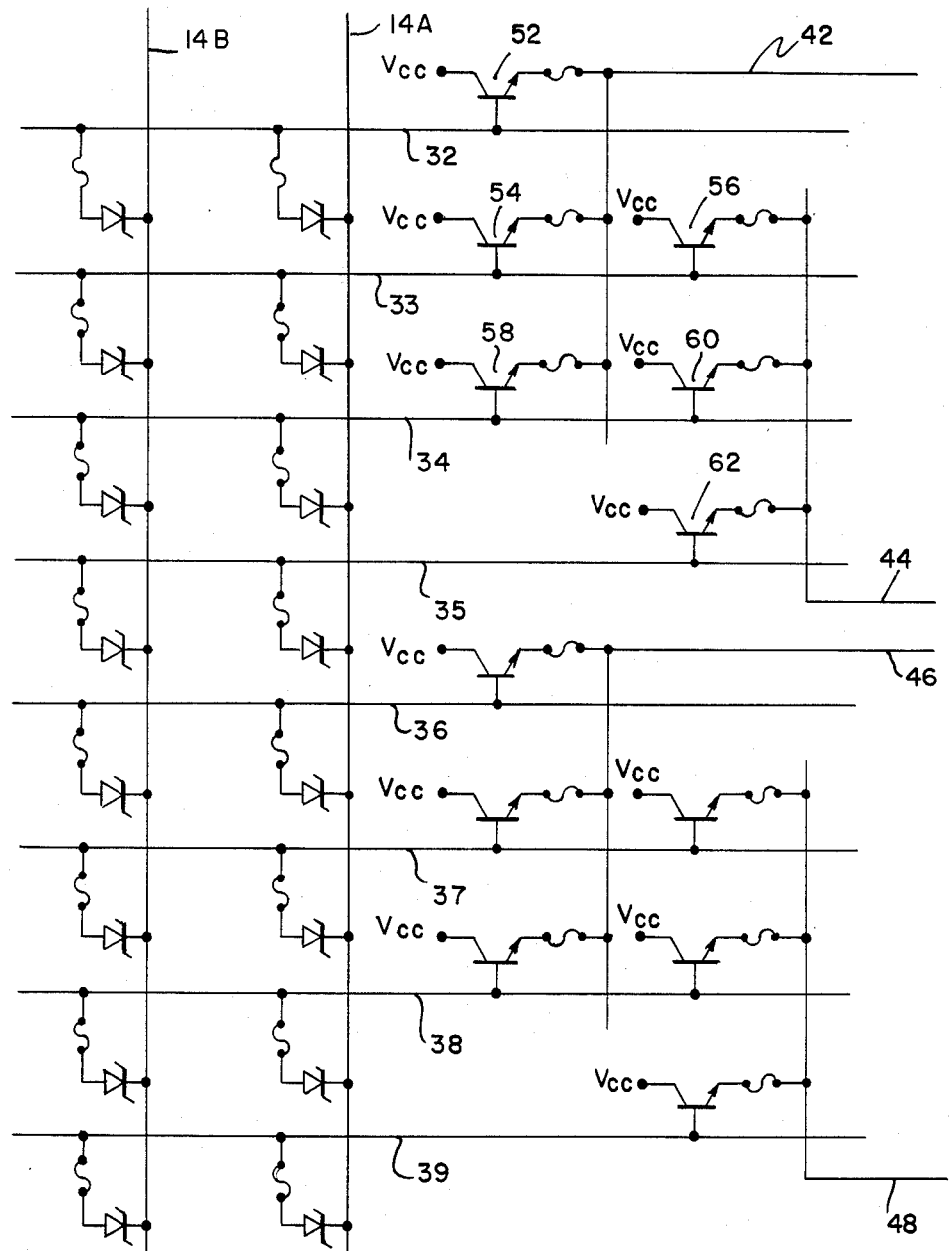
FIG. 2 shows a more detailed schematic diagram of a portion of the circuit of FIG. 1.

In FIG. 2, the AND function is implemented by a programmable diode array (the diode being provided as an isolation device). Inputs 14A and 14B, which represent two of the input terms 14 illustrated in FIG. 1, are connected to the current output end of a diode associated with each of the AND array outputs 32-39. The current input end of each diode is, in turn, connected by a fusible link to each of the respective outputs. Thus, an output which remains connected by the fusible links to both inputs 14A and 14B will be pulled low if either (or both) of the inputs is low. If both inputs are high, the output will also be high and the product term AB will be indicated.

Outputs 32-39 are connected to the control terminal (i.e., the base) of one or more emitter follower transistors, exemplified in FIG. 2 by transistors 52, 54, 56, 58, 60 and 62. The emitter of each transistor is connected by a fusible element to one or more of logic circuit outputs 42 and 44. A similar arrangement of transistors is associated in with logic circuit outputs 46 and 48. It should be noted at this point that the particular arrangement shown in FIG. 2 is intended for purposes of illustration only and it should be immediately apparent to those skilled in the art that other combinations of connections of array outputs to circuit outputs can be implemented while remaining well within the scope of the present invention.

The collector of each transistor is connected to a power source to provide current for driving the respective outputs. For purposes of example and illustration only, the emitter of transistor 52 is shown connected only to logic circuit output 42. Thus, when a selected combination of product terms causes output 32 to go high, transistor 52 conducts and circuit output 42 is connected to the power supply (i.e., is pulled high). Output 42 is also pulled high by transistors 54 and 58, assuming the associated fuse elements are left intact, when the selected combination of product terms cause array outputs 33 or 34 to go high. The emitters of transistors 56, 60 and 62 are selectively connected by fuse elements to circuit output 44. Thus, if all three fuse elements are left intact, circuit output 44 will be pulled high in response to a high voltage level on array outputs 33, 34 or 35. The product terms represented by these outputs are thus summed at output 44. Note that outputs 33 and 34 are common to both circuit outputs 42 and 44. The product terms represented by outputs 33 and 34 are thus shared by circuit outputs 42 and 44. Transistors 54 and 56 serve to isolate circuit output 42 from circuit output 44 when the product term represented by array output 33 is shared by both outputs. Similarly, transistors 58 and 60 serve to isolate the two circuit outputs when the product term represented by array 34 is shared. The isolation provided by these transistors allows for the simultaneous sharing of a single product term by more than one of the logic circuit outputs.

The preceding description of a preferred embodiment of the invention is intended for purposes of example and illustration only, and is by no means intended to limit the scope of the present invention to the particular embodiment shown. For example, the number of array outputs, the number of circuit outputs, the allocation of the particular product terms associated with the array outputs to the respective circuit outputs and the device used to provide isolation (which may, for example, be a diode or an MOS device), may all vary. Thus, the spirit and scope of the present invention is to be limited only by the terms of the appended claims.

What is claimed is:

1. A programmable logic circuit, comprising:
   an array having a plurality of inputs and plurality of outputs and means for combining selected ones of said inputs at each of said outputs;
   logic means for selectively connecting a first set of said array outputs to a first one of a plurality of programmable logic circuit outputs;
   logic means for selectively connecting a second set of said array outputs to a second programmable logic circuit output;
   wherein, said first set of array outputs includes less than all of said array outputs and, wherein said first set of array outputs includes at least one array output in common with said second set of array outputs.

2. A programmable logic circuit according to claim 1, wherein said second set of array outputs includes less than all of said array outputs.

3. A programmable logic circuit according to claim 1, wherein said array is an AND array.

4. A programmable logic circuit according to claim 1, wherein said means for connecting each of said array outputs to said logic circuit outputs comprises a programmable logic element serially connected to means for electrically isolating said first and second logic circuit outputs.

5. A programmable logic circuit according to claim 4, wherein said isolation means includes a three-terminal device having a first terminal connected to said programmable element, a second terminal connected to a power source and a third terminal connected to one of said array outputs.

6. A programmable logic circuit according to claim 5, wherein said three-terminal device is a transistor and said third terminal is a control terminal.

7. A programmable logic circuit, comprising:
an array having a plurality of inputs for receiving input terms and a plurality of array outputs and means for combining selected ones of said input terms at each of said array outputs;
means for connecting a first array output to a first one of a plurality of outputs of said programmable logic circuit;
means for connecting a second array output to a second programmable logic circuit output; and
means for selectively connecting a third array output to either or both of said first and second programmable logic circuit outputs;
wherein said selective connection means includes logic means, having inputs connected to the array outputs, and outputs which are connected to the programmable logic circuit outputs, for selectively combining the array outputs at said programmable logic circuit outputs.

8. A programmable logic circuit according to claim 7, wherein said array is a product term generator and said combinations of input terms at said array outputs are product terms.

9. A programmable logic circuit according to claim 7, wherein said means for connecting each of said array outputs to said programmable logic circuit outputs comprises a programmable element serially connected to means for electrically isolating said first and second logic circuit outputs.

10. A programmable logic circuit according to claim 9, wherein said isolation means includes a three-terminal device having a first terminal connected to said programmable element, a second terminal connected to a power source and a third terminal connected to one of said array outputs.

11. A programmable logic circuit according to claim 10, wherein said three-terminal device is a transistor and said third terminal is a control terminal.

* * * * *